United States Patent
Hitomi et al.

(10) Patent No.: US 10,010,987 B2
(45) Date of Patent: Jul. 3, 2018

(54) METHOD OF MOUNTING SUBSTRATE SUPPORT IN CHAMBER, METHOD OF DISMOUNTING SUBSTRATE SUPPORT AND AUXILIARY TRANSPORT TOOL

(71) Applicant: ASM IP Holding B.V., Almere (NL)

(72) Inventors: Taku Hitomi, Yokohama (JP); Miho Majima, Suginami-ku (JP)

(73) Assignee: ASM IP Holding B.V., Almere (NL)

( * ) Notice: Subject to any disclaimer, the term of this patent is extended or adjusted under 35 U.S.C. 154(b) by 18 days.

(21) Appl. No.: 14/529,211

(22) Filed: Oct. 31, 2014

(65) Prior Publication Data

US 2016/0121462 A1    May 5, 2016

(51) Int. Cl.
| | |
|---|---|
| B25B 11/00 | (2006.01) |
| B23Q 3/18 | (2006.01) |
| H01L 21/687 | (2006.01) |
| B23P 19/00 | (2006.01) |
| B23P 11/02 | (2006.01) |

(52) U.S. Cl.
CPC ........ B23Q 3/186 (2013.01); H01L 21/68785 (2013.01); H01L 21/68792 (2013.01); *B23P 11/025* (2013.01); *B23P 19/002* (2013.01); *Y10T 29/49815* (2015.01); *Y10T 29/49826* (2015.01); *Y10T 29/49876* (2015.01); *Y10T 29/49895* (2015.01)

(58) Field of Classification Search
CPC .............. B23Q 3/186; H01L 21/68792; H01L 21/68785; B23P 19/002; Y10T 29/49876; Y10T 29/49826; Y10T 29/49815; Y10T 29/49895
See application file for complete search history.

(56) References Cited

U.S. PATENT DOCUMENTS

| | | | | |
|---|---|---|---|---|
| 6,378,742 B1* | 4/2002 | Rohr | ................... | B67D 1/0835 222/482 |
| 7,612,735 B2* | 11/2009 | Essig, Jr. | ............... | B01D 61/06 343/709 |
| 8,726,421 B2* | 5/2014 | Alvarez | ............ | A41D 13/0512 2/207 |

FOREIGN PATENT DOCUMENTS

JP    2010-205790 A    9/2010

* cited by examiner

*Primary Examiner* — John C Hong
(74) *Attorney, Agent, or Firm* — Studebaker & Brackett PC

(57) ABSTRACT

A method of mounting a substrate support in a chamber includes placing an auxiliary transfer tool having a first portion and a second portion in a chamber which provides a processing space and an additional space, and which has an opening for communication between the additional space and the outside, the first portion in an expanded state being positioned in the processing space and the second portion being positioned in the additional space, inserting a substrate support having a contact portion for supporting the substrate, a rod portion, and a threaded portion connecting to the rod portion, the rod portion being slid on a side surface of the second portion, shrinking the first portion so that the rod portion is moved downward in the additional space and the threaded portion projects out of the chamber through the opening.

7 Claims, 7 Drawing Sheets

COMPARATIVE EXAMPLE

METHOD OF MOUNTING SUBSTRATE SUPPORT IN CHAMBER, METHOD OF DISMOUNTING SUBSTRATE SUPPORT AND AUXILIARY TRANSPORT TOOL

BACKGROUND OF THE INVENTION

Field of the Invention

The present invention relates to a method of mounting a substrate support in a chamber, a method of dismounting the substrate support and an auxiliary transport tool using these methods.

Background Art

Japanese Patent Laid-Open No. 2010-205790 discloses a substrate support (susceptor) for supporting a substrate. A coating is ordinarily provided on the uneven surface of the substrate support. With use of the substrate support, the irregularities are crushed or the coating is separated. There is, therefore, a need to periodically replace the substrate support. The substrate support is mounted in a chamber at the time of assembly of an apparatus. Thus, there is a need to mount the substrate support in the chamber and dismount the substrate support from the chamber at a certain frequency.

There is a problem that the substrate support collides against a chamber wall when the substrate support is mounted in or dismounted from the chamber. This collision causes generation of metal dust in the chamber or damage to the substrate support such that the substrate support cannot be fixed in the chamber.

In particular, the weight of a substrate support on which a 300-mm wafer is placed is, for example, as large as 15 kg and the weight of a substrate support on which a 450-mm wafer is placed is, for example, as large as 30 kg. Therefore, collision of such a substrate support against a chamber wall has a serious effect.

SUMMARY OF THE INVENTION

The present invention has been achieved to solve the above-described problem, and an object of the present invention is to provide a method of mounting a substrate support in a chamber, a method dismounting the substrate support and an auxiliary transport tool enabling prevention of collision of the substrate support against a chamber wall.

The features and advantages of the present invention may be summarized as follows.

According to one aspect of the present invention, a method of mounting a substrate support in a chamber, includes a setting step of placing an auxiliary transfer tool having a first portion capable of being expanded by being charged with a gas and a second portion connecting to the first portion in a chamber which provides a processing space for processing a substrate and an additional space smaller in width than the processing space, and which has an opening for communication between the additional space and the outside, the first portion in an expanded state being positioned in the processing space, and the second portion being positioned in the additional space, an insertion step of inserting a substrate support having a contact portion for supporting the substrate, a rod portion connecting to the contact portion, and a threaded portion connecting to a distal end of the rod portion, the rod portion of the substrate support being slid on a side surface of the second portion until the contact portion is put on the first portion, a shrinkage step of shrinking the first portion by discharging the gas from the first portion so that the rod portion is moved downward in the additional space and the threaded portion projects out of the chamber through the opening, and a fixing step of fixing the substrate support in the chamber by using the threaded portion.

According to another aspect of the present invention, a method of dismounting, from a chamber providing a processing space for processing a substrate and an additional space smaller in width than the processing space, and having an opening for communication between the additional space and the outside, a substrate support which has a contact portion for supporting the substrate, a rod portion connecting to the contact portion, and a threaded portion connecting to a distal end of the rod portion, and which is fixed in the chamber by using the threaded portion projecting to the outside from the opening, the method includes, a preparatory step of positioning, between the chamber and a lower surface of the contact portion, a first portion of an auxiliary transport tool having the first portion and a second portion connecting to the first portion, the first portion being capable of being expanded by being charged with a gas, and a lift step of lifting the substrate support until the entire threaded portion enters the additional space, the first portion being expanded, the rod portion being slid on a side surface of the second portion in the additional space.

According to another aspect of the present invention, an auxiliary transfer tool includes an annular first portion capable of being expanded by being charged with a gas, and an annular second portion connected to a lower surface of the first portion and smaller in outside diameter than the first portion.

Other and further objects, features and advantages of the invention will appear more fully from the following description.

DETAILED DESCRIPTION OF THE PREFERRED EMBODIMENTS

Figure 1:
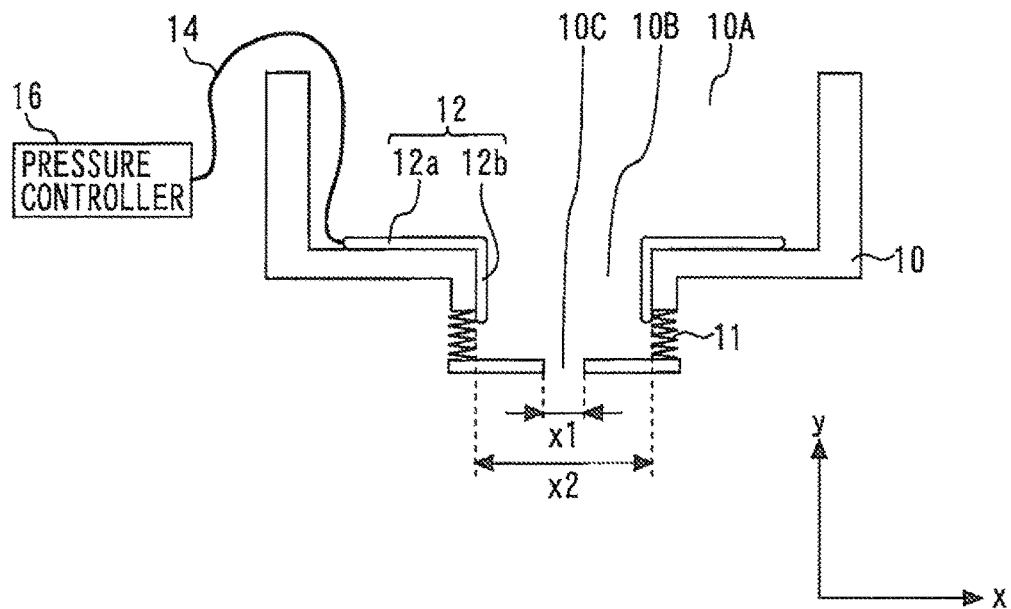
FIG. 1 is a sectional view of a chamber.

A method of mounting a substrate support in a chamber, a method dismounting the substrate support and an auxiliary transport tool according to an embodiment of the present invention will be described with reference to the drawings. Identical or corresponding components are indicated by the same reference characters and repeated description of them is avoided in some cases.

First Embodiment

A method of mounting a substrate support in a chamber according to a first embodiment of the present invention will be described with reference to FIGS. 1 to 6. FIG. 1 is a sectional view of a chamber. A chamber housing 10 has such a shape as to provide a processing space 10A for processing a substrate and an additional space 10B smaller in width than the processing space 10A. The additional space 10B is positioned below the processing space 10A. The chamber housing 10 has an opening 10C for communication between the additional space 10B and the outside. The width x1 of the opening 10C is smaller than the width x2 of the additional space 10B. A bellows 11 is installed at the chamber housing 10 such that a bottom portion of the chamber housing 10 can move downward or upward by air drive.

First, an auxiliary transport tool 12 is provided in the chamber housing 10. The auxiliary transport tool 12 has a first portion 12a capable of being expanded by being charged with a gas and a second portion 12b connecting to the first portion 12a. In the present embodiment, the second portion 12b can also be expanded by being charged with a gas. The first portion 12a is positioned in the processing space 10A, while the second portion 12b is positioned in the additional space 10B. The auxiliary transport tool 12 is formed of a material with elasticity, such as a vinyl or rubber material, such that it does not scratch a metal when brought into contact with the metal.

A gas pressure control unit 16 is connected to the first portion 12a by a tube 14. A gas can be caused to flow into or out of the first and second portions 12a and 12b by controlling the gas pressure control unit 16. The kind of gas is not particularly specified. The gas is, for example, high-pressure $N_2$ gas.

Figure 2:
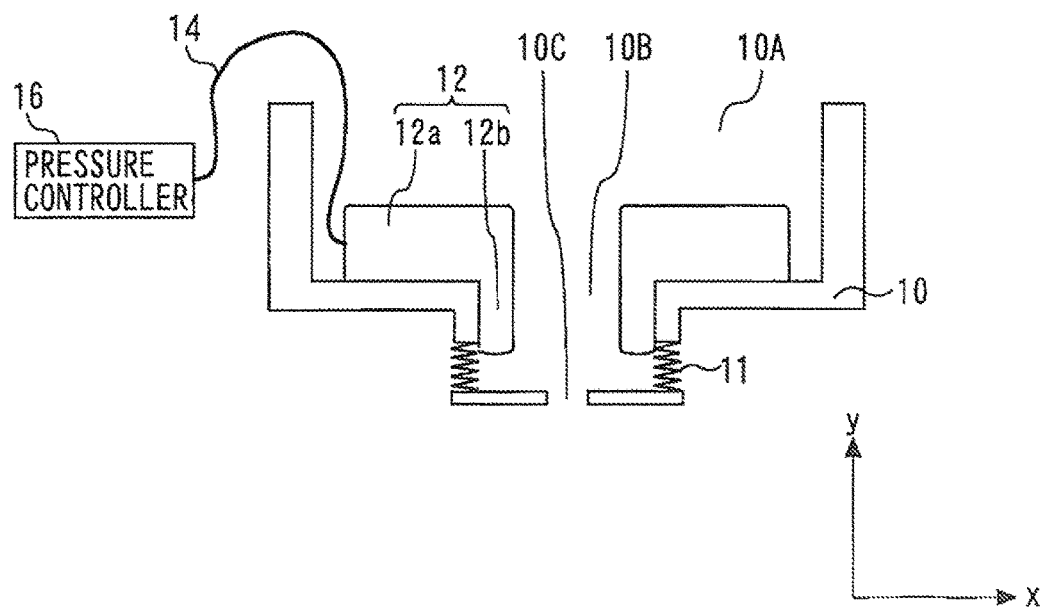
FIG. 2 is a sectional view of the expanded first portion and other portions.

Next, the gas pressure control unit 16 is controlled to charge the first and second portions 12a and 12b with the gas, thereby expanding these portions. FIG. 2 is a sectional view of the expanded first portion and other portions. The expanded first portion 12a is positioned in the processing space 10A. The second portion 12b is positioned in the additional space 10B. As can be understood from comparison between the auxiliary transport tool 12 shown in FIG. 1 and the auxiliary transport tool 12 shown in FIG. 2, the first portion 12a expands in the positive y-direction and the second portion 12b expands along the x-direction. A process step of setting the auxiliary transport tool 12 in the chamber housing 10 in this way is called a setting step.

Figure 3:
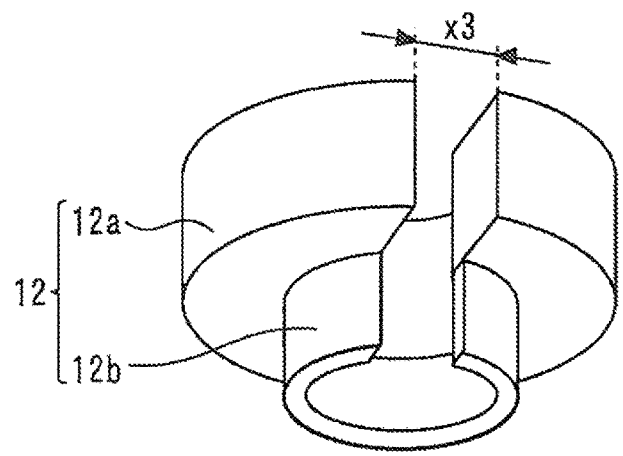
FIG. 3 is a perspective view of the auxiliary transport tool.

FIG. 3 is a perspective view of the auxiliary transport tool in the state where the first portion and the second portion are expanded. The first and second portions 12a and 12b are formed into an annular shape as viewed in plan. The outside diameter of the second portion 12b is smaller than that of the first portion 12a. The inside diameters of the first portion 12a and the second portion 12b are equal to each other. One end of the auxiliary transport tool 12 and the other end of the auxiliary transport tool 12 are at a distance x3 from each other and the auxiliary transport tool 12 has an annular shape with a cut as viewed in plan.

Figure 4:
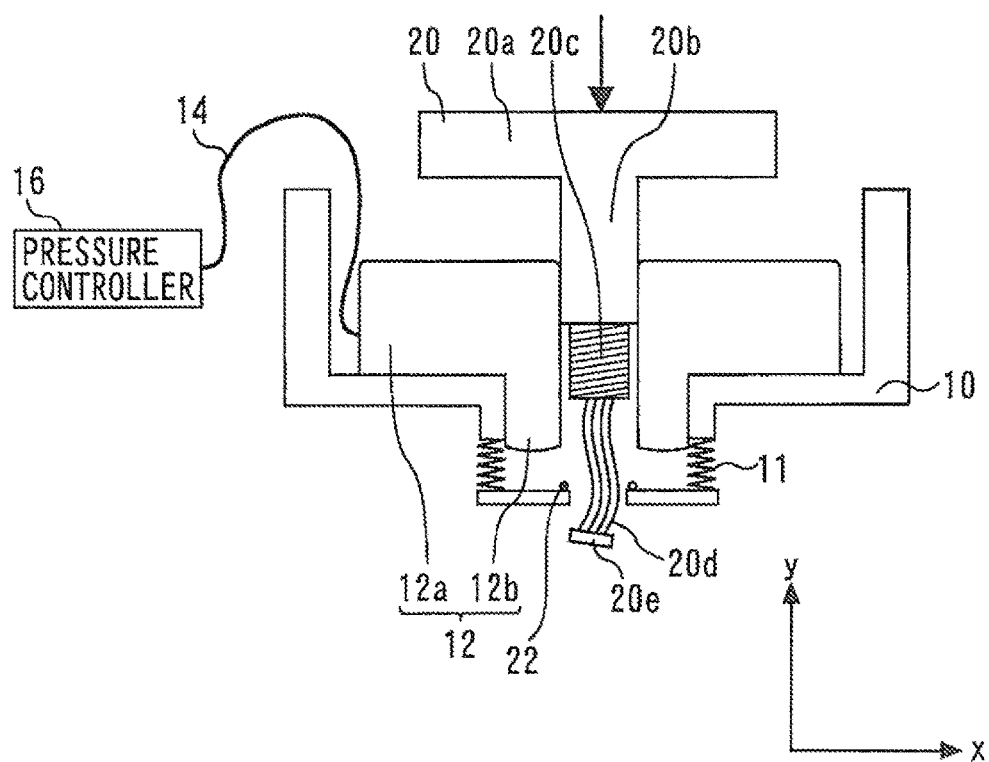
FIG. 4 is a diagram showing the insertion step.

The process then advances to an insertion step. FIG. 4 is a diagram showing the insertion step. FIG. 4 illustrates a substrate support 20. The substrate support 20 has a contact portion 20a, a rod portion 20b, a threaded portion 20c, wiring 20d and a connector 20e. The contact portion 20a is a portion for supporting a substrate to be processed. The rod portion 20b is a portion connecting to the contact portion 20a. The threaded portion 20c is a portion connected to the distal end of the rod portion 20b. The wiring 20d extends downward from the threaded portion 20c. The wiring 20d include, for example, a heater wire for heating the contact portion 20a and a thermocouple for measuring the temperature of the contact portion 20a.

Figure 5:
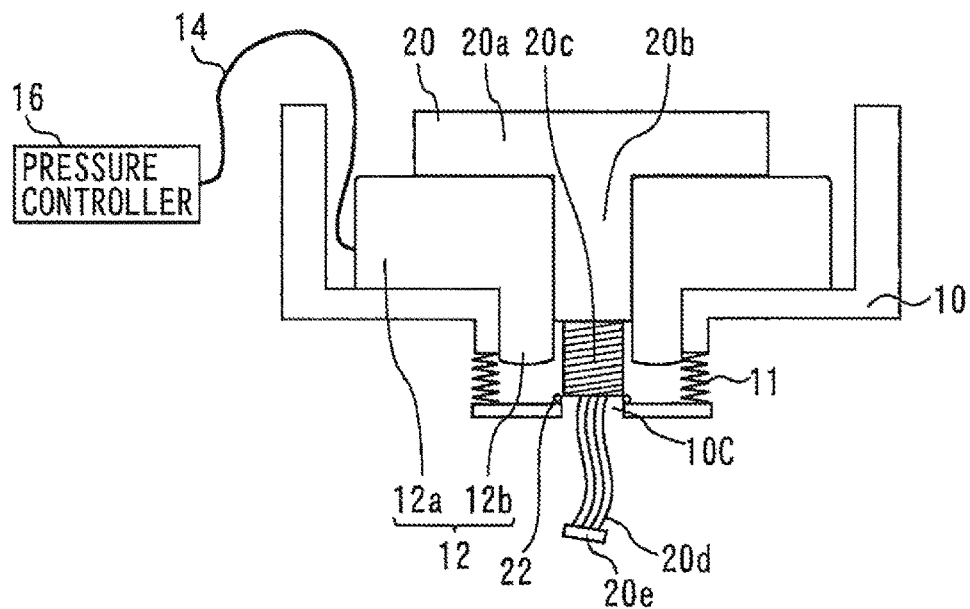
FIG. 5 is a sectional view of the substrate support and other components after the insertion step.

In the insertion step, the substrate support 20 is manually moved downward, with the rod portion 20b slid on a side surface of the second portion 12b. FIG. 4 illustrates a state where the rod portion 20b is slid on the side surface of the second portion 12b. The slide is continued until the contact portion 20a is put on the first portion 12a. FIG. 5 is a sectional view of the substrate support 20 and other components after the insertion step. The contact portion 20a is on the first portion 12a, and the rod portion 20b is surrounded with the second portion 12b. Positioning of the rod portion 20b can be performed by bringing the rod portion 20b into contact with the side surface of the second portion 12b so that the threaded portion 20c is positioned right above the opening 10C.

At an arbitrary time before advancement to a step subsequent to the insertion step, an O-ring 22 is placed in the additional space 10B so as to surround the opening 10C as viewed in plan.

Figure 6:
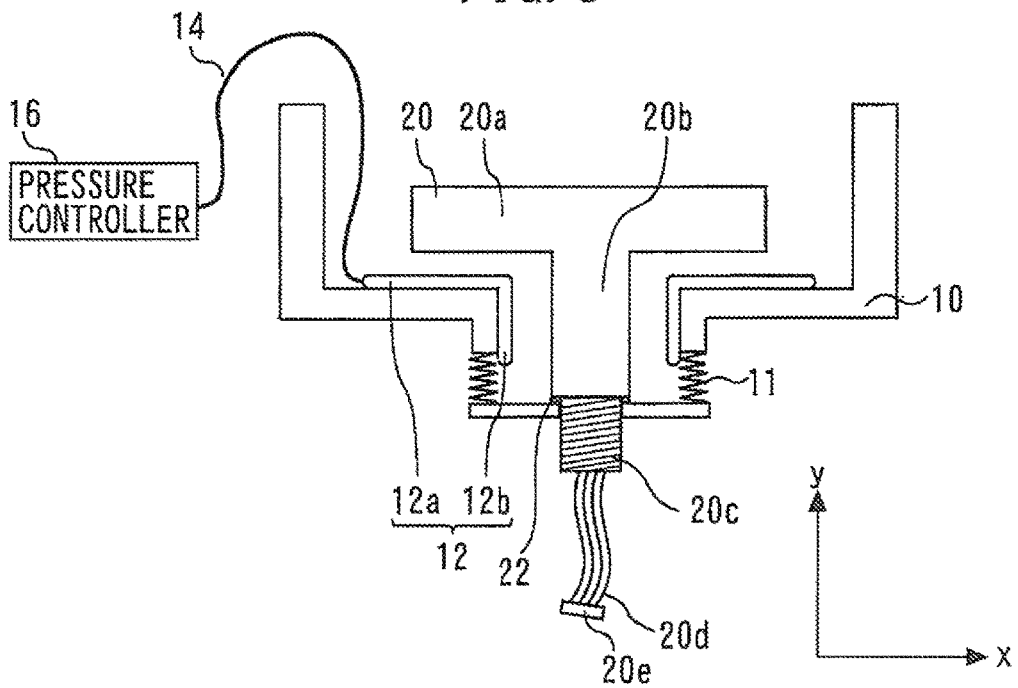
FIG. 6 is a diagram for explaining the shrinkage step.

Subsequently, the process advances to a shrinkage step. FIG. 6 is a diagram for explaining the shrinkage step. In the shrinkage step, the gas pressure control unit 16 is controlled to remove the gas in the first and second portions 12a and 12b and to thereby cause the first and second portions 12a and 12b to shrink. As these portions shrink, the rod portion 20b moves straight downward in the additional space 10B and the threaded portion 20c projects out of the chamber housing 10 through the opening 10C. Also, the O-ring 22 is deformed by being pinched between a lower surface of the rod portion 20b and the chamber housing 10.

The threaded portion 20c is positioned right above the opening 10C when the insertion step is completed. In the shrinkage step, therefore, the threaded portion 20c can be put out of the chamber housing 10 without colliding against the chamber housing 10.

Figure 7:
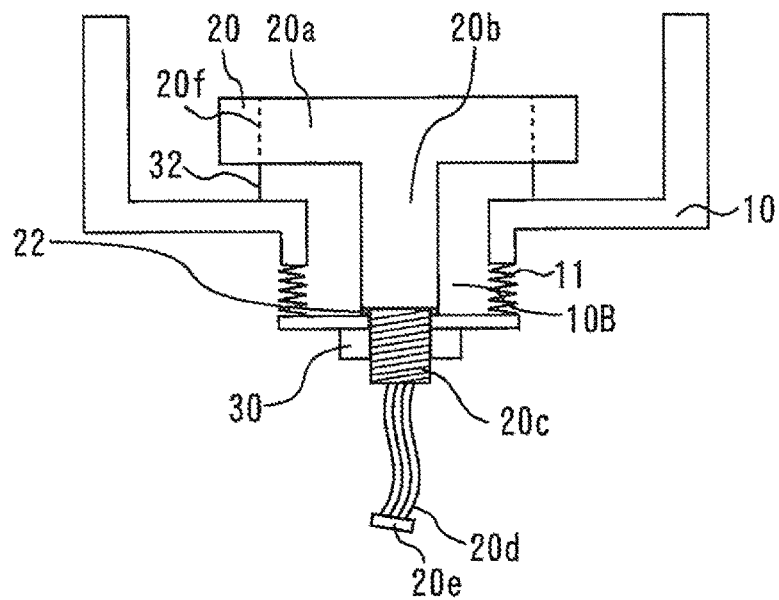
FIG. 7 is a diagram for explaining the fixing step.

The process advances to a fixing step. FIG. 7 is a diagram for explaining the fixing step. The substrate support 20 is fixed in the chamber housing 10 by using the threaded portion 20c projecting out of the chamber housing 10. More specifically, a nut 30 is fixed on the threaded portion 20c. The nut 30 is fastened on the threaded portion 20c with sufficient force, thereby sufficiently deforming the O-ring 22 and isolating the additional space 10B from the outside. Pins 32 are thereafter inserted in through holes 20f provided in the contact portion 20a. When the substrate support 20 is moved downward by air drive, the upper ends of the pins 32 support a substrate. When the substrate support 20 is moved upward by air drive, the upper ends of the pins 32 are in the through holes 20f.

Mounting of the substrate support 20 in the chamber housing 10 is thus completed.

Figure 8:
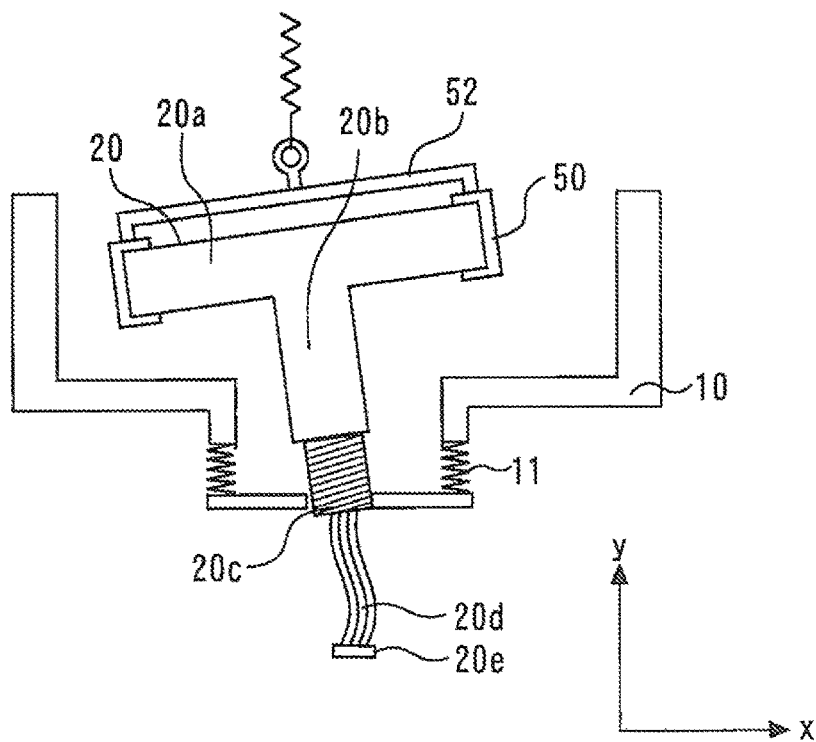
FIG. 8 shows a method of mounting a substrate support in a chamber according to a comparative example.

A comparative example will be described to facilitate understanding of the present invention. FIG. 8 shows a method of mounting a substrate support in a chamber according to a comparative example. A hanging-up tool 52 is fixed to clamps 50 clamping the contact portion 20a. The hanging-up tool 52 is held by a crane or the like. The substrate support 20 is gradually moved downward. Ideally, the substrate support 20 is moved straight downward (in the negative y-direction). However, the substrate support 20 sways leftward or rightward and there is a possibility of the threaded portion 20c colliding against the chamber housing 10.

The threaded portion 20c is ordinarily formed of a soft material such as aluminum. Therefore, when the threaded portion 20c collides against the chamber housing 10, the thread is crushed or part of the threaded portion 20c is chipped off to produce a particle source. Also, the wiring 20d may be damaged by being pinched between the substrate support 20 and the chamber housing 10 by leftward/rightward (x-direction) sway of the substrate support 20. Also, due to clamping of the contact portion 20a with the clamp 50, irregularities in the upper surface of the contact portion 20a are reduced or a coating on the upper surface of the contact portion 20a is separated.

The method of mounting the substrate support in the chamber according to the first embodiment of the present invention enables the threaded portion 20c of the substrate support 20 to be positioned right above the opening 10C of the chamber housing 10 by using the auxiliary transport tool 12. The substrate support 20 can be moved straight downward in the negative y-direction by discharging the gas from the first portion 12a, thereby enabling the threaded portion 20c to be put out without colliding against the chamber housing 10. Any portion of the substrate support 20 other than the threaded portion 20c does not collide against the chamber housing 10. Also, no leftward/rightward sway of the substrate support 20 occurs in the shrinkage step. There is, therefore, no risk of the wiring 20d being pitched between the substrate support 20 and the chamber housing 10. Since there is no need to bring a clamp into contact with the contact portion 20a, there is no possibility of deterioration of irregularities and a coating on the upper surface of the contact portion 20a.

The method of mounting the substrate support in the chamber according to the first embodiment of the present invention can be variously modified. In the first embodiment, the auxiliary transport tool 12 capable of expanding both of the first and second portions 12a and 12b is used. However, an auxiliary transport tool capable of expanding only the first portion and incapable of expanding the second portion may alternatively be used. In a case where the second portion is not expanded, the inside diameter of the second portion in annular form may be set approximately equal to the diameter of the rod portion 20b to enable the rod portion 20b to be slid on the second portion 12b.

In each of the case where the second portion 12b is expanded and the case where the second portion 12b is not expanded, it is preferable to form the second portion 12b of Teflon. The slidability of the rod portion 20b on the second portion 12b can be improved by forming the second portion 12b of Teflon. This effect can be obtained by forming only the surface of the second portion 12b of Teflon. It is also preferable to form the second portion 12b of a solid elastic material in order to avoid damage to the rod portion 20b when the second portion 12b is brought into contact with the rod portion 20b.

Instead of being expanded in the chamber housing 10, the first portion 12a may be expanded before the auxiliary transport tool 12 is placed in the chamber housing 10.

Figure 9:
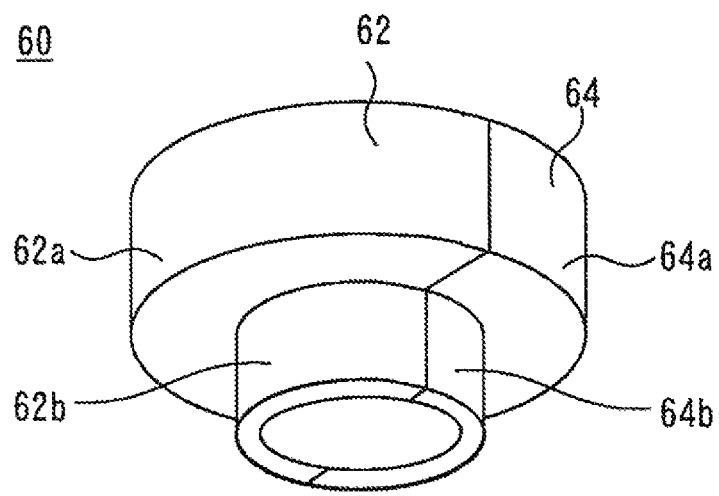
FIG. 9 is a perspective view of an auxiliary transport tool.

FIG. 9 is a perspective view of an auxiliary transport tool 60 according to a modified example. The auxiliary transport tool 60 has a part 62 and a part 64 provided separately from the part 62. The part 62 has a first portion 62a and a second portion 62b. The part 64 has a first portion 64a and a second portion 64b. The auxiliary transport tool 60 in annular form as a whole without discontinuity as viewed in plan can be provided by having the parts 62 and 64 capable of being maintained in contact with each other. Use of the auxiliary transport tool 60 in annular form without discontinuity enables increasing the accuracy of positioning of the substrate support in the insertion step. The distance x3 in FIG. 3 may be set smaller than the diameter of the rod portion 20b.

While the auxiliary transport tool shown in FIG. 9 is formed of two parts, an auxiliary transport tool may be formed of three or more parts. An auxiliary transport tool in annular form as a whole without discontinuity as viewed in plan can be provided by using a plurality of parts of the auxiliary transport tool to be maintained in contact with each other in the chamber.

Figure 10:
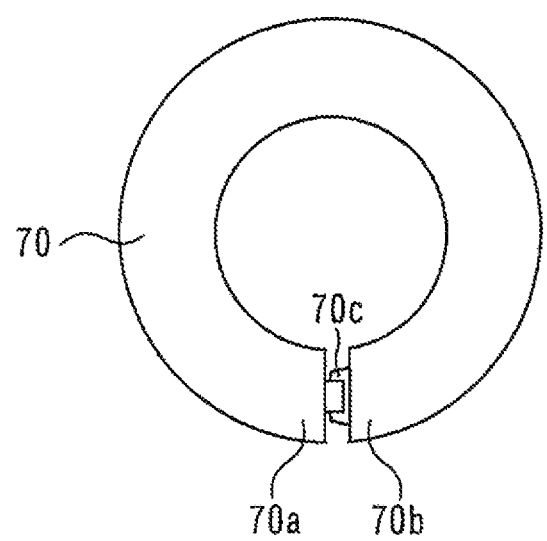
FIG. 10 is a plan view of an auxiliary transport tool.

FIG. 10 is a plan view of an auxiliary transport tool 70 according to another modified example. The auxiliary transport tool 70 is formed into an annular shape having one end 70a and another end 70b. The auxiliary transport tool 70 has a snap button 70c. In the setting step, one end 70a of the auxiliary transport tool 70 is fixed on the other end 70b with the snap button 70c, thereby maintaining the auxiliary transport tool 70 in annular form without discontinuity as viewed in plan.

As means for fixing one end of the auxiliary transport tool and the other end of the auxiliary transport tool to each other, not limited to the snap button, a surface fastener, for example, may be used.

Substrate supports are used in substrate processing apparatuses, e.g., film forming apparatuses, exposure apparatuses, etching apparatuses and CMP apparatuses. Therefore, the method of mounting the substrate support in the chamber according to the first embodiment of the present invention can be used in various substrate processing apparatuses.

The arrangement may be such that the threaded portion 20c is worked by D-cutting and the opening 10C is also formed so as to be D-shaped as viewed in plan. This enables prevention of rotation of the substrate support 20 relative to the chamber housing 10 and enables fixing the position of the through holes 20f of the contact portion 20a. These modified examples are also applicable in an embodiment described below.

Second Embodiment

A method of dismounting the substrate support according to a second embodiment of the present invention will be described. The method of dismounting the substrate support is a method of dismounting the substrate support fixed in the chamber from the chamber. This method includes a preparatory step and a lift step.

Figure 11:
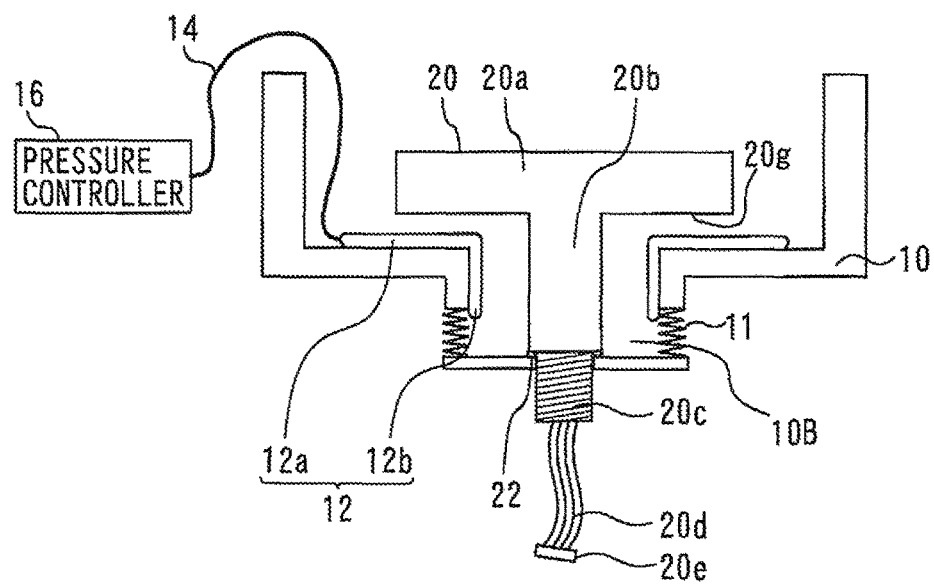
FIG. 11 is a diagram for explaining the preparatory step.

FIG. 11 is a diagram for explaining the preparatory step. In the preparatory step, the first portion 12a of the auxiliary transport tool 12 is positioned between the chamber housing 10 and a lower surface 20g of the contact portion 20a. Further, the second portion 12b is positioned in the additional space 10B. These operations are manually performed.

Figure 12:
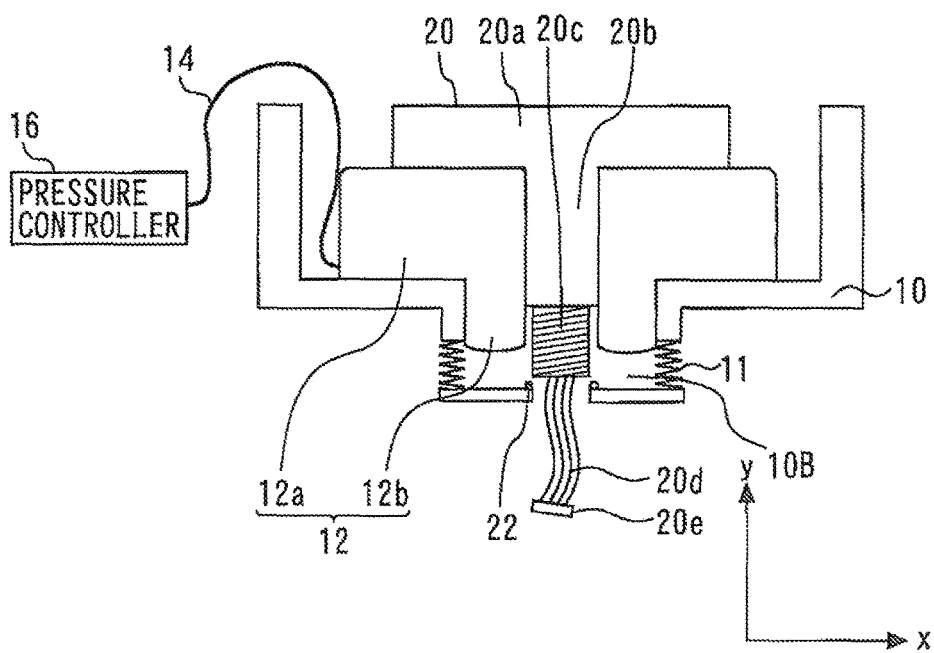
FIG. 12 is a diagram for explaining the lift step.

The process then advances to the lift step. FIG. 12 is a diagram for explaining the lift step. In the lift step, the gas pressure control unit 16 is controlled to expand the first and second portions 12a and 12b. By this expansion, the rod portion 20b is slid on the side surface of the second portion 12b in the additional space 10B, and the substrate support 20 is lifted until the entire threaded portion 20c enters the additional space 10B. Thereafter, the substrate support 20 is manually taken out of the chamber housing 10.

There has been the problem that the threaded portion 20c or the like collides against the chamber housing 10 if the substrate support 20 sways leftward or rightward when the substrate support 20 is dismounted from the chamber housing 10. In the method of dismounting the substrate support according to the second embodiment of the present invention, the rod portion 20b is slid on the side surface of the second portion 12b when the substrate support 20 is lifted. That is, because of the abutment of the rod portion 20b on the second portion 12b, the rod portion 20b cannot sway easily leftward or rightward. Thus, the problem of the threaded portion 20c colliding against the chamber housing 10 can be solved.

While a case where both of the first portion 12a and the second portion 12b are expanded in the lift step has been described, only the first portion 12a may be expanded. In such a case, the second portion 12b is formed so as to be sufficiently thick in order to control leftward/rightward sway of the substrate support 20. More specifically, it is preferable to set the inside diameter of the second portion 12b equal to the diameter of the rod portion 20b.

Figure 13:
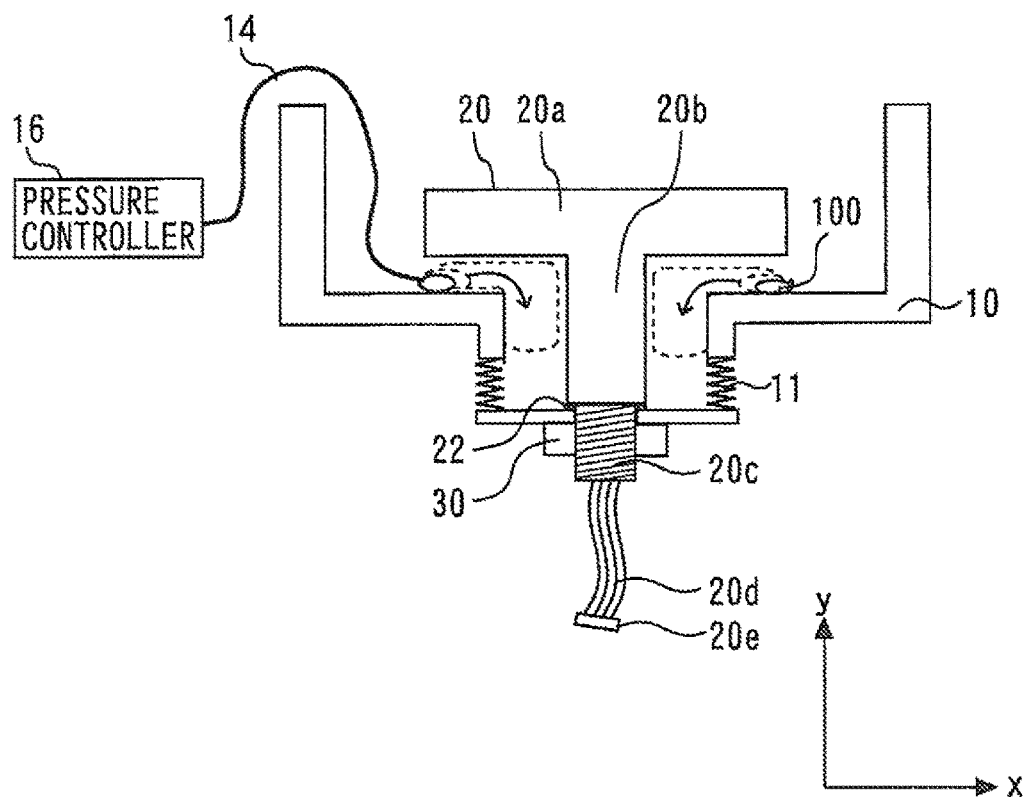
FIG. 13 is a diagram showing a placement of the entire auxiliary transport tool in the processing space in the preparatory step.

If the spacing between the chamber housing 10 and the lower surface 20g of the contact portion 20a is small, it is difficult to position the second portion 12b in the additional space 10B in the preparatory step. In such a case, the entire auxiliary transport tool 12 may be placed in the processing space 10A. FIG. 13 is a diagram showing a placement of the entire auxiliary transport tool in the processing space in the preparatory step. In this case, the auxiliary transport tool is expanded so as to fill the space between the chamber housing 10 and the substrate support 20 in the lift step. That is, the auxiliary transport tool is expanded in directions of arrows in FIG. 13 to enable the second portion 12b to reach a position in the additional space 10B.

Obviously many modifications and variations of the present invention are possible in the light of the above teachings. It is therefore to be understood that within the scope of the appended claims the invention may be practiced otherwise than as specifically described.

What is claimed is:

1. A method of mounting a substrate support in a chamber, comprising:
    a setting step of placing an auxiliary transfer tool having a first portion capable of being expanded by being charged with a gas and a second portion connecting to the first portion in a chamber which provides a processing space for processing a substrate and an additional space smaller in width than the processing space, and which has an opening for communication between the additional space and the outside of the chamber, the first portion in an expanded state being positioned in the processing space, and the second portion being positioned in the additional space;
    an insertion step of inserting a substrate support having a contact portion for supporting the substrate, a rod portion connecting to the contact portion, and a threaded portion connecting to a distal end of the rod portion, the rod portion of the substrate support being slid on a side surface of the second portion until the contact portion is put on the first portion;
    a shrinkage step of shrinking the first portion by discharging the gas from the first portion so that the rod portion is moved downward in the additional space and the threaded portion projects out of the chamber through the opening; and
    a fixing step of fixing the substrate support in the chamber by using the threaded portion.

2. The method of mounting a substrate support in a chamber according to claim 1, wherein the second portion can be expanded by being charged with the gas, and
    wherein both of the first portion and the second portion are expanded in the setting step.

3. The method of mounting a substrate support in a chamber according to claim 1, wherein a surface of the second portion is formed of Teflon.

4. The method of mounting a substrate support in a chamber according to claim 1, wherein the substrate support is provided with a piece of wiring extending downward from the threaded portion.

5. The method of mounting a substrate support in a chamber according to claim 1, wherein the second portion is formed into an annular shape as viewed in plan.

6. The method of mounting a substrate support in a chamber according to claim 1, wherein the auxiliary transfer tool is formed of a plurality of parts which are maintained in contact with each other in the chamber so as to form an annular shape as a whole without discontinuity as viewed in plan.

7. The method of mounting a substrate support in a chamber according to claim 1, wherein the auxiliary transfer tool is formed into an annular shape having one end and another end, and
    wherein the one end of the auxiliary transfer tool is fixed to the other end of the auxiliary transfer tool in the setting step so that the auxiliary transfer tool is in annular form without discontinuity as viewed in plan.

* * * * *